United States Patent
Basker et al.

(10) Patent No.: US 8,723,262 B2
(45) Date of Patent: May 13, 2014

(54) SOI FINFET WITH RECESSED MERGED FINS AND LINER FOR ENHANCED STRESS COUPLING

(75) Inventors: Veeraraghavan S. Basker, Schenectady, NY (US); Huiming Bu, Millwood, NY (US); Effendi Leobandung, Wappingers Falls, NY (US); Theodorus E. Standaert, Clifton Park, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,893

(22) Filed: Sep. 7, 2012

(65) Prior Publication Data
US 2013/0154005 A1 Jun. 20, 2013

Related U.S. Application Data

(63) Continuation of application No. 13/330,746, filed on Dec. 20, 2011, now Pat. No. 8,445,334.

(51) Int. Cl.
H01L 27/01 (2006.01)
H01L 27/12 (2006.01)
H01L 31/0392 (2006.01)

(52) U.S. Cl.
USPC ............................ 257/347; 257/353; 257/354

(58) Field of Classification Search
USPC ................................................. 257/353, 354
See application file for complete search history.

(56) References Cited

U.S. PATENT DOCUMENTS

| | | | |
|---|---|---|---|
| 6,265,291 B1 | 7/2001 | Yu et al. | |
| 6,690,072 B2 | 2/2004 | Cabral, Jr. et al. | |
| 6,972,250 B2 | 12/2005 | Cabral, Jr. et al. | |
| 7,179,745 B1 * | 2/2007 | Waite et al. | 438/694 |
| 7,282,766 B2 | 10/2007 | Okuno | |
| 7,396,710 B2 | 7/2008 | Okuno | |
| 7,582,567 B1 | 9/2009 | Syau et al. | |
| 7,851,865 B2 | 12/2010 | Anderson et al. | |
| 2006/0228862 A1 | 10/2006 | Anderson et al. | |
| 2006/0261411 A1 | 11/2006 | Hareland et al. | |
| 2008/0067613 A1 | 3/2008 | Anderson et al. | |
| 2008/0230852 A1 | 9/2008 | Yu et al. | |
| 2008/0237712 A1 | 10/2008 | Wei et al. | |

(Continued)

OTHER PUBLICATIONS

Ghani, T., et al., "A 90 nm High Volume Manufacturing Logic Technology Featuring Novel 45 nm Gate Length Strained Silicon CMOS Transistors," IEDM 2003, p. 978-980.

(Continued)

*Primary Examiner* — Thien F Tran
(74) *Attorney, Agent, or Firm* — Cantor Colburn LLP; Vazken Alexanian

(57) ABSTRACT

FinFETS and methods for making FinFETs with a recessed stress liner. A method includes providing an SOI substrate with fins, forming a gate over the fins, forming an off-set spacer on the gate, epitaxially growing a film to merge the fins, depositing a dummy spacer around the gate, and recessing the merged epi film. Silicide is then formed on the recessed merged epi film followed by deposition of a stress liner film over the FinFET. By using a recessed merged epi process, a MOSFET with a vertical silicide (i.e. perpendicular to the substrate) can be formed. The perpendicular silicide improves spreading resistance.

13 Claims, 9 Drawing Sheets

(56) References Cited

U.S. PATENT DOCUMENTS

| | | |
|---|---|---|
| 2009/0065817 A1 | 3/2009 | Cartier et al. |
| 2009/0152638 A1 | 6/2009 | Belyansky et al. |
| 2009/0212366 A1 | 8/2009 | Chang et al. |
| 2009/0224321 A1 | 9/2009 | Tsuchiya |
| 2009/0280629 A1 | 11/2009 | Tan et al. |
| 2009/0321841 A1 | 12/2009 | Hoentschel et al. |
| 2011/0062518 A1 | 3/2011 | Chan et al. |
| 2011/0101455 A1 | 5/2011 | Basker et al. |
| 2011/0223736 A1 | 9/2011 | Lin et al. |
| 2011/0284967 A1 | 11/2011 | Cheng et al. |
| 2011/0291188 A1 | 12/2011 | Cheng et al. |

OTHER PUBLICATIONS

Horstmann, M., et al., "Integration and Optimization of Embedded SiGe, Compressive and Tensile Stressed Liner Films, and Stress Memorization in Advanced SOI CMOS Technologies," IEDM 2005, p. 233-236.

Kawasaki, H., et al., "Challenges adn Solutions of FinFET Integration in an SRAM Cell and a Logic Circuit for 22 nm node and beyond", IEDM 2009, p. 289-292.

Shang, H., et al., "Investigation of FinFET devices for 32 nm Technologies and Beyond," IEEE 2006 Symposium on VLSI Technology Digest of Technical Papers, Oct. 2006, p. 54-55.

Yagishita, A. et al., "FinFET SRAM Process Technology for hp32 nm Node and Beyond," IEEE International Conference on Intergrated Circuit Design and Technology, 2007, ICICDT07, p. 1-4.

Bangsaruntip, S., et al., "High Performance and High Uniform Gate-All-Around Silicon Nanowire MOSFETs with Wire Size Dependent Scaling," IEDM 2009, p. 297-300.

Yang, H.S., et al., "Dual Stress Liner for High Performance sub-45nm Gate Length SOI CMOS Manufacturing," IEDM 2004, p. 1075-1077.

International Search Report and Written Opinion for International Application No. PCT/US12/62964; International Filing Date: Nov. 1, 2012; Date of mailing: Jan. 9, 2013; 18 pages.

\* cited by examiner

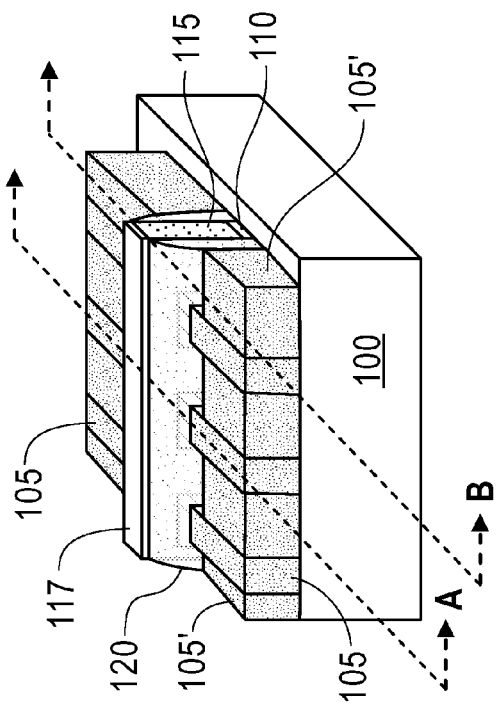
FIG. 4
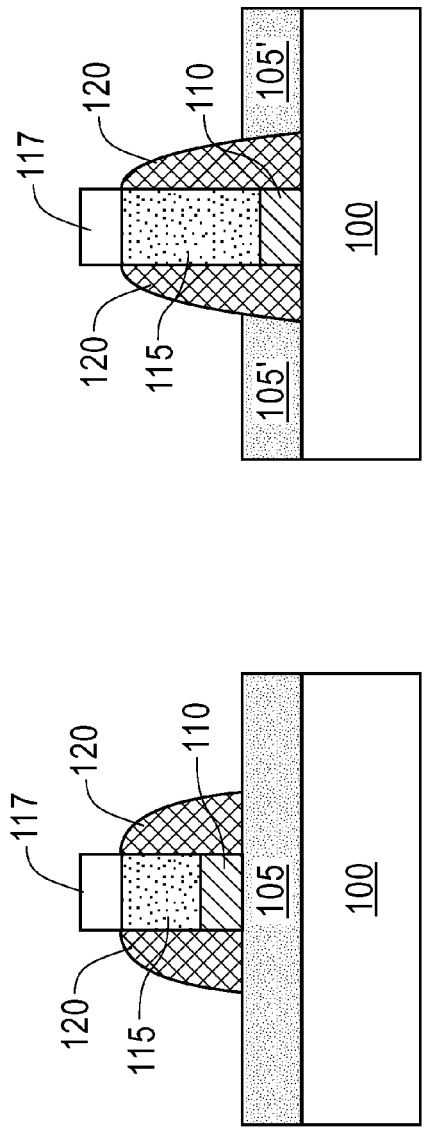
FIG. 4A
FIG. 4B

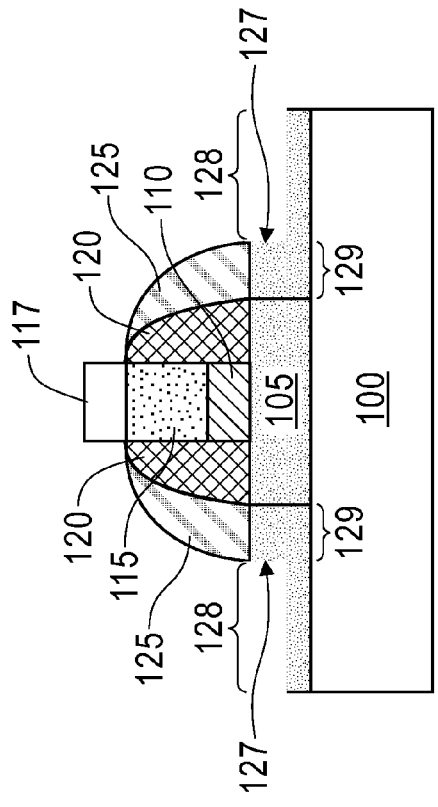
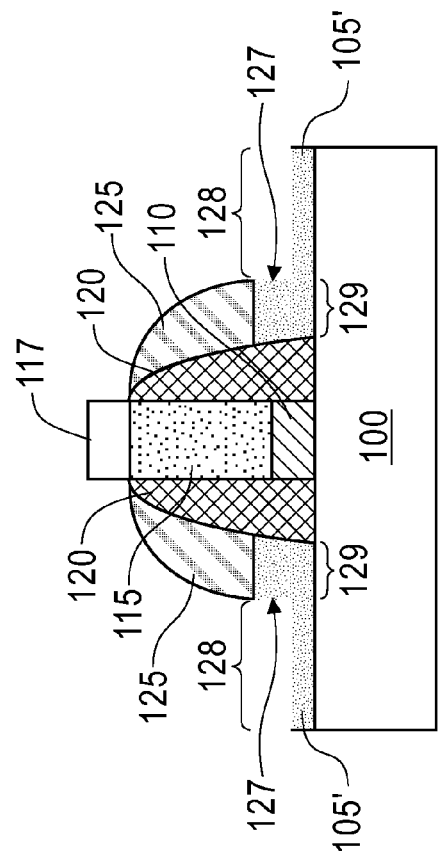
FIG. 5A
FIG. 5B
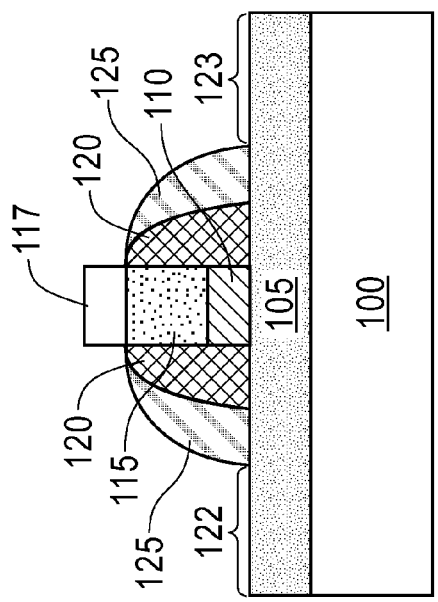
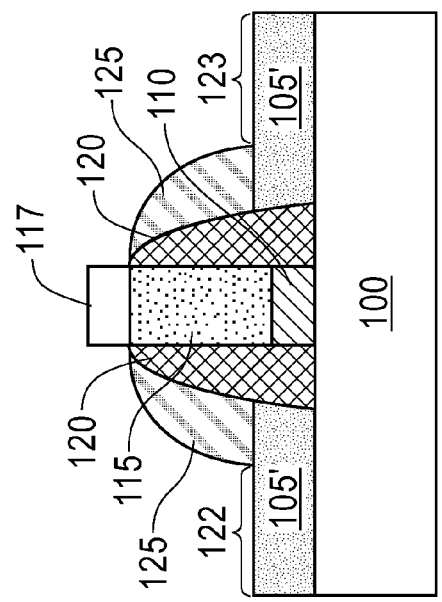
FIG. 6A
FIG. 6B

SOI FINFET WITH RECESSED MERGED FINS AND LINER FOR ENHANCED STRESS COUPLING

CROSS-REFERENCE TO RELATED APPLICATION

This application is a continuation of U.S. patent application Ser. No. 13/330,746, filed Dec. 20, 2011, now U.S. Pat. No. 8,445,334, the disclosure of which is incorporated by reference herein in its entirety.

BACKGROUND OF THE INVENTION

1. Field of the Invention

The present invention generally relates to a non-planar Metal Oxide Semiconductor Field Effect Transistors (MOSFETs) made on semiconductor on insulator (SOI) substrates wherein the MOSFET has a stress enhancement layer. In particular, the invention relates to FinFETs with a merged source drain region in which the merged region is recessed and a stress adjustment layer which is deposited over the source drain region and a gate stack of the FinFET.

2. Description of Related Art

In a paper entitled "A 90 nm High Volume Manufacturing Logic Technology Featuring Novel 45 nm Gate Length Strained Silicon CMOS Transistors," by T. Ghani et al. in IEDM 2003 a nitride layer to create tensile stress in nMOS devices and recessed SiGe source drains to create compressive stress in pMOS devices is disclosed. The devices are planar on a bulk silicon substrate.

In a paper entitled "Dual Stress Liner for High Performance sub-45 nm Gate Length SOI CMOS Manufacturing," by H. S. Yang et al. in IEEE International Electronic Device Meeting 2004, a planar device built on an SOI substrate using a dual stress liner (tensile to nMOS and compressive to pMOS) is disclosed.

In a paper entitled "Integration and Optimization of Embedded SiGe, Compressive and Tensile Stressed Liner Films, and Stress Memorization in Advanced SOI CMOS Technologies," in IEDM 2005, M. Hortsmann discloses an optimized 4-way stress integration on partially-depleted SOI (PD-SOI) CMOS planar substrate. An embedded-SiGe process and a compressive-stressed liner film are used to induce compressive strain in the PMOS (PMOS "stressors"). A stress memorization process and a tensile-stressed liner film are used to induce tensile strain in the NMOS (NMOS "stressors").

U.S. Patent Application 2009/0152638 A1 by Belyansky et al. filed on Dec. 13, 2009 describes a Complimentary Metal Oxide Semiconductor (CMOS) planar transistor in which the pFETs have a compressive nitride stress layer and the nFETs have a tensile nitride layer. In addition, the pFET and nFET nitride layers can be topped by a compressive oxide layer and tensile oxide layer, respectively.

In U.S. published patent application No. 2006/0261411 A1, Hareland et al. disclose a tri-gate device with a stress film which completely surrounds the channel (i.e. is beneath the channel, too).

In a paper entitled "FinFET SRAM Process Technology for hp32 nm Node and Beyond," by Atsushi Yagishita published in 2007 IEEE ICICDT07 it is disclosed that a reduction in FinFET width deteriorates current drive and leads to high parasitic resistance (increased source drain series resistance). The article states raised source drains reduce parasitic resistance, lower S/D series resistance and improves drive current. The article warns against merging raised source drains (i.e. epi-merge process) because (1) it increases the capacitance between the gate and the source/drain, and (2) it increases the chance of a short circuit between adjacent nFET fins and pFET fins.

In a paper entitled "Investigation of FinFET devices for 32 nm Technologies and Beyond," by H. Shang in IEEE 2006 Symposium on VLSI Technology Digest of Technical Papers, October 2006, a FinFET source/drain (S/D) contact scheme is proposed in which individual fins without large S/D landing pads can be later merged by selective epitaxy. According to Shang, multi-gate MOSFETs (such as the FinFET and Tri-gate FET) are potential device candidates for the 32 nm node and beyond. Shang's concerns, however, include the formation of narrow and uniform fins while providing low series resistance from the extension and contact regions of the device. In addition the fins must be placed at a fine pitch to make efficient use of layout area. Previous demonstrations use large S/D landing pads for a simplified contact scheme which Shang claims is unsuitable for a realistic technology. Shang examines spacer formation, raised S/D (RSD) by selective Si epitaxy, silicidation, and an integration scheme of individual fins (without large S/D landing pads) being merged by selective epitaxy. Shang reports there is a tradeoff between increased parasitic capacitance and reduced parasitic resistance.

In a U.S. Pat. No. 7,851,865 B2, Anderson discloses a FinFET on SOI in which the fins are merged by a conductive material (silicide) deposited over an epi layer which in turn is over the fins. Note, that Anderson's epi layer does not merge the fins, instead the silicide merges the fins.

In U.S. published patent application No. 2008/0067613 A1, Anderson et al. discloses a strapping between fins which can involve some raised source drains being taller than others.

In a paper entitled "Challenges and Solutions of FinFET Integration in an SRAM Cell and a Logic Circuit for 22 nm Node and Beyond," in IEDM 2009 H. Kawaski et al., discloses merged diamond shaped fins.

In a paper entitled "High Performance and High Uniform Gate-All-Around Silicon Nanowire MOSFETs with Wire Size Dependent Scaling," by S. Bangsaruntip in IEDM 2009 merged source drains on SOI substrate with suspended nanowires (rather than fins) are disclosed.

In U.S. published patent application No. US 2008/0230852 A1, Yu discloses fins in different transistors may be of different heights.

BRIEF SUMMARY OF THE INVENTION

An object of the invention is to provide a method for making MOSFETs on SOI substrates. The method includes providing a substrate with a plurality of fins and forming a gate stack above the substrate. The gate stack has at least one sidewall upon which an off-set spacer is formed. An epitaxial film is grown over the substrate which merges the fins to form an epi-merge layer. A dummy spacer is formed on the portion of the gate (and the off-set spacer) which extends above the epi-merge layer. After forming the dummy spacer, at least a portion of the epi-merge layer is removed which results in the formation of an epi-merge spacer region and an epi-merge sidewall. (Optionally, the removal of a portion of the epi-merge layer results in a recess so that an epi-merge field region is also formed.) Subsequently, a silicide is formed with the epi-merge sidewall (and the epi-merge field region when that option is used). Finally, a stress liner is deposited above the substrate.

According to another aspect of the invention a MOSFET with an SOI substrate with fins is provided. The SOI substrate includes an insulator region. The MOSFET also gate stack with at least one side wall. Adjacent the sidewall is an off-set spacer, and adjacent at least a portion of the off-set spacer is a dummy spacer. The MOSFET also has an epi-merge layer which includes a spacer region which is sandwiched above the insulator region and below the dummy spacer. In another region, the MOSFET has a field silicide above the insulator. A stress liner is above the field silicide and optionally can be simultaneously above other areas of the MOSFET (for example, the gate stack).

According to a further aspect of the invention, a MOSFET has a source, a drain and a gate stack separating the source and the drain. Furthermore, there is a channel under the gate stack. A silicide layer is on the source and drains such that a portion of the silicide layer is perpendicular to the channel. Finally, the MOSFET has a stress liner above the gate stack and the substrate.

An advantage of the recessed epi-merge layer is that the closer proximity of the liner to the channel results in improved stress transfer to the channel and improves the device performance as compared to non-recessed 3D devices. A further advantage of the recessed epi-merge region is that a vertical silicide is formed in the plane of the channel thus reducing spreading resistance. An additional advantage is that by forming dummy spacers after source/drain ion implantation, the gate is shielded from possible silicide encroachment to minimize the possibility of shorting the gate. In yet another advantage, the effective switching capacitance (Ceff) is reduced due to the lower PC-to-epi fringe capacitances.

Other characteristics and advantages of the invention will become obvious in combination with the description of accompanying drawings, wherein the same number represents the same or similar parts in all figures.

BRIEF DESCRIPTION OF THE SEVERAL VIEWS OF THE DRAWINGS

FIG. 4 illustrates a cross section of a MOSFET after an epi-merge layer is formed according to a method step in an embodiment of the current invention. Dotted lines represent cross sections along the y-axis further illustrated in FIGS. 4A and 4B.

FIG. 4A illustrates a cross section of a MOSFET after an epi-merge layer is formed according to an embodiment of the current invention. The cross-section along the y-axis following a merged fin as it goes under the gate stack.

FIG. 4B illustrates a cross section of a MOSFET after an epi-merge layer is formed according to an embodiment of the current invention. The cross-section is through the gate-stack along the y-axis according to an embodiment of the invention.

FIG. 5A illustrates a cross section of a MOSFET after a dummy spacer is formed according to an embodiment of the current invention. The cross-section along the y-axis following a merged fin as it goes under the gate stack.

FIG. 5B illustrates a cross section of a MOSFET after a dummy spacer is formed according to an embodiment of the current invention. The cross-section is through the gate-stack along the y-axis according to an embodiment of the invention.

FIG. 6A illustrates a cross section of a MOSFET after recessing an epi-merge layer according to an embodiment of the current invention. The cross-section along the y-axis following a merged fin as it goes under the gate stack.

FIG. 6B illustrates a cross section of a MOSFET after recessing an epi-merge layer according to an embodiment of the current invention. The cross-section is through the gate-stack along the y-axis according to an embodiment of the invention.

DETAILED DESCRIPTION OF THE PREFERRED EMBODIMENTS

The basic principle of the invention is a method for creating a high performance FinFET by recessing an epi-merge region and forming a stress liner over the merged region and gate stack. The method will be described in conjunction with FIGS. 1-8. The invention also includes a structure of a Fin- FET having an epi-merge field area which is recessed, an epi-merge spacer area, and an optional vertical silicide which is perpendicular to the substrate. In addition to the earlier figures, the structure will be further described in conjunction with FIGS. 9-10. A detailed description of the invention is made in combination with the following embodiments. Please note that reference numbers are merely reference numbers and, thus, do not necessarily restrict the method to the numerical order of the reference numbers.

Figure 1:
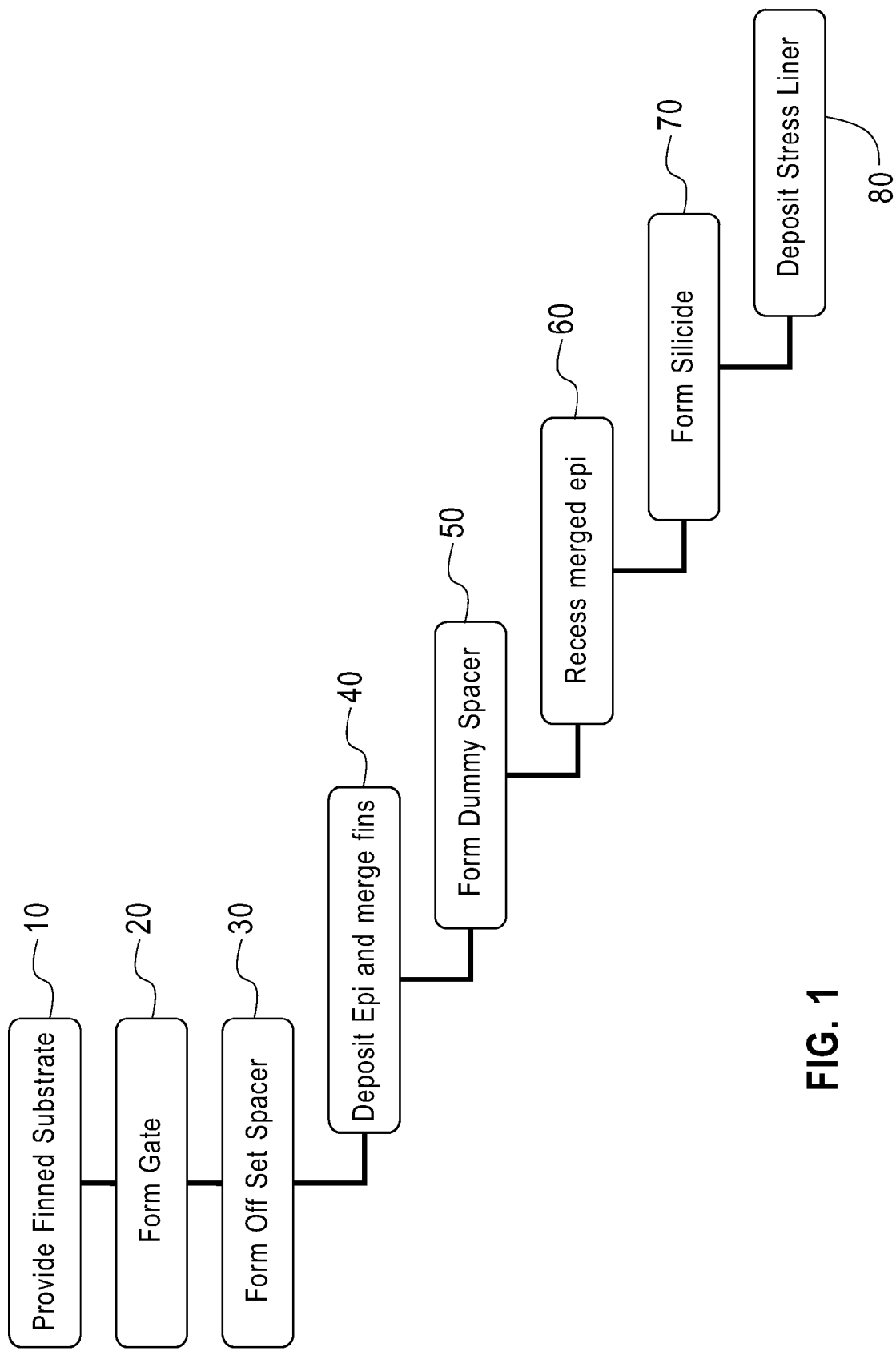
FIG. 1 is a flow chart of a method of making a MOSFET according to an embodiment of this invention.

FIG. 1 is a flow chart with method steps of creating a high performance FinFET with a recessed epi-merge field region according to an embodiment of the invention. Step 10 is providing a substrate with fins, step 20 is forming a gate stack; step 30 forming off-set spacer adjacent to the gate stack; step 40 is growing an epitaxial layer which merges the fins to form an epi-merge layer; step 50 is forming dummy spacers adjacent to at least a portion of the gate stack; step 60 is recessing the epi-merge region; step 70 is forming a silicide with the epi-merge layer; step 80 is depositing a stress liner film. Each of the steps will be discussed in detail below.

Figure 2:
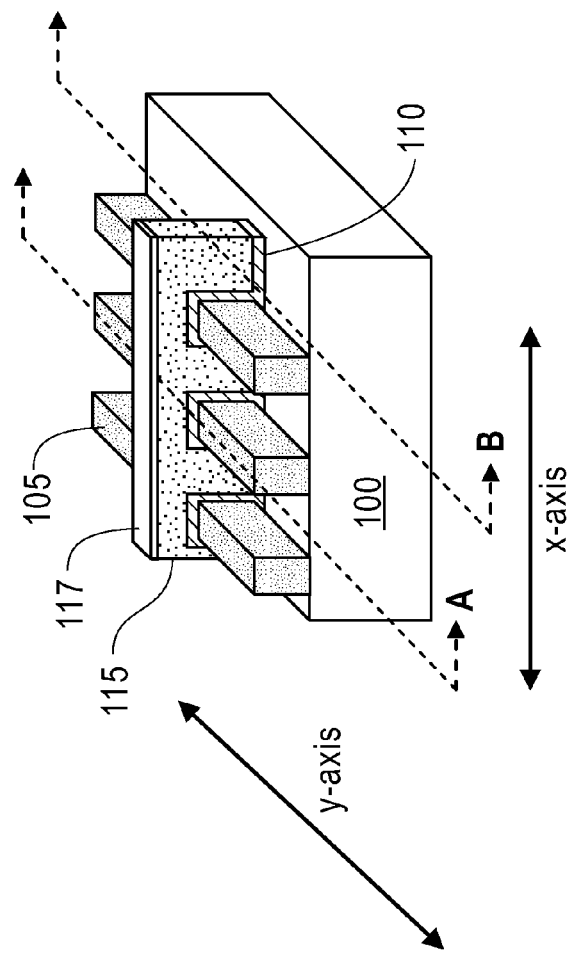
FIG. 2 illustrates a starting point of a method according to an embodiment of the invention in which a substrate with fins and a gate stack is provided. Dotted lines represent cross sections along the y-axis further illustrated in FIGS. 2A and 2B.

Creating a high performance FinFET with recessed epi-merge region starts by providing a substrate 100 as shown in FIG. 2. The substrate can be a semiconductor on insulator substrate (SOI). SOI substrates, are made of three parts: a bottom bulk semiconductor section, a buried insulator section (often referred to as "BOX"), and a semiconductor layer on top of the BOX. In this application, the semiconductor layer on top of the BOX has been etched to form fins 105. Thus, in FIG. 2, reference numeral 100 includes the bulk semiconductor layer and the BOX of the substrate. The semiconductor on insulator layer of the substrate is the fins 105.

Continuing with FIG. 2, typically, the insulating layer of the BOX is an oxide, preferably silicon dioxide. The semiconductor on insulator layer, which has been etched to form fins 105, can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The height of the fins 105 can range from about 10 nm to about 80 nm and ranges there between, but is preferably about 30 nm. The width of the fins can range from about 5 nm to about 50 nm and ranges there between, but is preferably about 10-12 nm. The pitch of the fins can range from about 30 nm to about 150 nm and ranges there between, but is preferably about 40 nm.

A gate stack is on the substrate. The gate stack includes two parts: a metal gate 115 and a high dielectric constant material 110. FIG. 2 shows the SOI substrate 100 with a metal gate 115 and high dielectric constant film 110 (herein referred to as "high-k") formed using conventional patterning techniques.

Figure 2A:
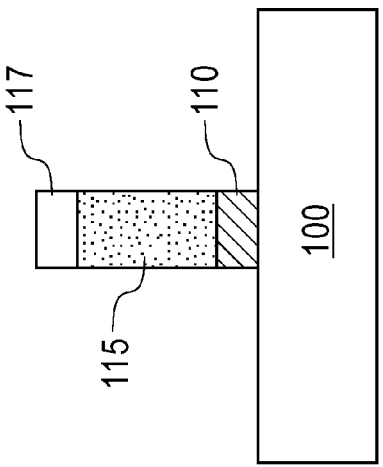
FIG. 2A illustrates a cross section of a starting point of a method according to an embodiment of the invention in which a substrate with fins and a gate stack is provided. The cross-section along the y-axis following a fin as it goes under the gate stack.

From FIG. 2 it can be seen that the gate stack runs roughly perpendicular to the fins 105 and crosses over the fins 105. The dotted lines represent areas in which cross sections of FinFET are taken along the y-axis. For example, dotted line A is a cross section along the y-axis of the substrate 100 in which if follows a fin 105 through the intersection of the fin 105 with gate stack. In FIG. 2A the cross section shows substrate 100, fin 105, high-k 110 over the fin 105, and the metal gate 115 over the high-k 110. Optionally, there is a hard mask 117 material remaining over the metal gate 115.

Figure 2B:
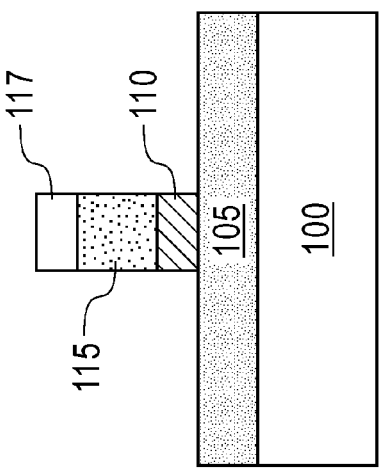
FIG. 2B illustrates a cross section of a starting point of a method according to an embodiment of the invention in which a substrate with fins and a gate stack is provided. The cross-section is through the gate-stack along the y-axis according to an embodiment of the invention.

Dotted line "B" of FIG. 2 is also a cross section along the y-axis of the substrate 100, but this time in an area in which there is only a gate stack. FIG. 2B shows the cross section. In FIG. 2B there is the substrate 100, high-k material 110 and metal gate 115. Optionally, there is a hard mask 117 material remaining over the metal gate 115.

Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum. The high-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metalorganic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of those methods. Preferably the deposition method is ALD. The high-k thickness may range from 0.5 to 3 nm, but is preferably 10-20 Angstroms.

Suitable metal gate materials can include, but are not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material can further comprise dopants that are incorporated during or after deposition. Preferably, the metal gate includes a bottom layer of titanium nitride followed by a polysilicon layer. On top of the polysilicon layer, there can be a hardmask 117. The hardmask preferably is, or at least contains, a silicon oxide ($SiO_x$) though a variety of insulating materials could be used singularly or in combination. A film containing silicon and nitrogen are also suitable as hardmasks. Suitable processes described above for high-k deposition can be used for forming the metal gate. The thickness of the metal gate may range from 10 nm to 100 nm. In a preferred embodiment the thickness of the titanium nitride layer is about 10 nm and the thickness of the polysilicon layer is about 40 nm-50 nm. The hardmask 117, as deposited, is about 20 nm, but can be from about 0 nm-10 nm after etching the gate stack.

The overall height of the gate stack (high-k 110 plus metal gate 115) may range from 10 nm to over 100 nm. It is preferred that the overall gate stack height exceeds the fins by about 15 nm to 40 nm. In a preferred embodiment, at step 20, the overall height of the gate stack is about 50 nm to about 60 nm and exceeds the height of the fins 105 by about 20 nm to 30 nm.

Figure 3A:
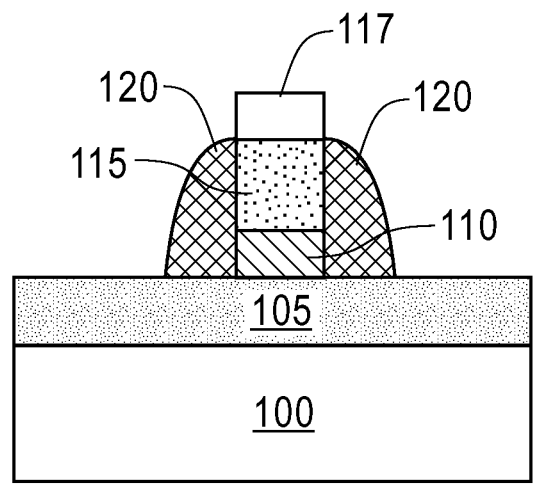
FIG. 3A illustrates a cross section of a MOSFET after an off-set spacer is formed according to an embodiment of the current invention. The cross-section along the y-axis following a fin as it goes under the gate stack.
Figure 3B:
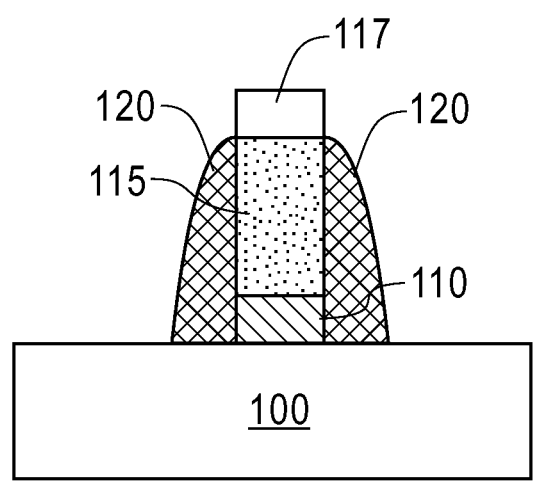
FIG. 3B illustrates a cross section of a MOSFET after an off-set spacer is formed according to an embodiment of the current invention. The cross-section is through the gate-stack along the y-axis according to an embodiment of the invention.

Referring to FIGS. 3A and 3B, an off-set spacer 120 is formed adjacent to the gate stack. To form an off-set spacer 120, a film is deposited over the entire surface of the substrate and then is etched anisotropically, meaning the horizontal surfaces etch faster than the vertical surfaces. In addition, the pitch and height of the fins allow the vertical sidewalls of the fins to be etched faster than the vertical sidewalls of the gate stack. Thus, the spacer material is left on the sidewall of the gate stack while it is largely removed from other surfaces. As a result, off-set spacers 120 are formed on the vertical sidewalls of the gate stack.

In FIGS. 3A and 3B the cross-sections show the sidewall of the gate stack (i.e. sidewalls of the metal gate 115 and high-k material 110); accordingly, the off-set spacer 120 can be seen in these cross-sections. The off-set spacer 120 is adjacent to the metal gate 115 and high-k material's 110 vertical sidewalls. Some residual off-set spacer material 120 may be left on top of the metal gate or on top of any remaining hard mask material 117, however, residual material is not shown in the figures.

As deposited the off-set spacer material is from about 40 Angstroms to 80 Angstroms and ranges there between, and is preferably 60 Angstroms. After material is etch, the off-set spacer can be up to 50 Angstroms at its widest point.

Off-set spacer 120 can be formed from silicon oxide, silicon nitride, silicon carbide, silicon oxynitride, silicon carbonnitride and is preferably a silicon nitride film. Off-set spacer 120 can be deposited using a variety of techniques physical vapor deposition, chemical vapor deposition and atomic layer deposition. The off-set spacer material is etched by reactive ion etching (RIE) with fluorine-based chemistries such as, but not limited to, $CH_2F_2$, $CHF_3$, $CF_4$, $NF_3$, or a combination of fluorine-based chemistries.

After the off-set spacers 120 are formed, an extension ion implant can be performed. By implanting at an angle of about 7 degrees followed by an anneal, dopants enter the fin 105 and can extend under the off-set spacer 120 and toward the fin 105 region under the gate stack (not shown in FIG. 3C). The dopant species commonly include B or $BF_2$ species for p-type doping and As or P for n-type doping, though other species are possible. After extension implant, an anneal is performed. The anneal temperature can range from about 800 C to about 1080 C and ranges there between.

An epi-merge layer is formed. Initially, the fins 105 are discrete structures; however, an epitaxial film of the same material as the fins 105 is grown on the fins 105. As growth continues, the fins become wider and wider until the individual fins 105 grow together. Thus, the merged fins form one large epi-merged layer 105'. The growth process can include an etching component such that growth on the top of the fins 105 is removed preferentially to growth on the sidewalls of the fins 105. With such a process, the fins merge laterally without growing too much vertically, if at all. After the epi-merge step the metal gate 115 is proud of the epi-merge layer 105'.

Referring to FIG. 4 the epi-merge layer 105' is shown to be about the same height as the original fin 105, though the height can vary so long as the top of the epi-merge layer 105' is lower than the top of the gate stack. While the fins 105 not covered by the gate stack are, in reality, largely indistinguishable from the epi-merge layer 105' they are shown in FIG. 4 for reference purposes. Since the epi-merge layer 105' only forms on the exposed portion of the fins 105, the portion of the fins 105 under the gate stack (high-k 110 and metal gate 115) cannot merge laterally and remain under the gate stack.

In FIG. 4A the cross-section is along the y-axis and through a fin 105. Even though the merge process made the epi-merge layer 105' largely indistinguishable from the fin 105, crosssection 4A has labeled the fin 105, for reference purposes only. It would also be correct to label the area not under the gate stack as an epi-merge layer 105' because it is now part of the epi-merge region.

In FIG. 4B, the cross-section is also along the y-axis, but this time through the epi-merge layer 105' rather than the original fin 105. Therefore, the epi-merge material is labeled 105'.

After the epi-merge layer 105' is formed, the layer can be implanted with dopants to form the source and drains (herein S/D) of the transistor by using convention methods and materials.

Referring to FIGS. 5A and 5B, making a FinFET with recessed epi-merge region involves forming the dummy spacer 125. To form a dummy spacer 125, a film is deposited over the entire surface of the substrate and then is etched anisotropically, meaning the horizontal surfaces etch faster than the vertical surfaces. Thus, the spacer material is left on the sidewall of the off-set spacer 120 while it is largely removed from other surfaces. As a result, dummy spacers 125 are formed adjacent the vertical sidewalls of the metal gate 115 which are, in turn, covered by off-set spacers 120.

FIGS. 5A and 5B cross-sections show the sidewall of the gate stack (i.e. sidewalls of the metal gate 115 and high-k material 110); accordingly, the dummy spacer 125 can be seen in these cross-sections. The dummy spacer 125 is adjacent to the metal gate 115 and preferably, has the off-set spacer 120 intervening between the dummy spacer 125 and metal gate 115. Note, that the dummy spacer 125 is not adjacent to the high-k material's 110 vertical sidewalls because the epi-merge layer 105' blocks the dummy spacer 125 from reaching the bottom of the gate stack. Thus, after dummy spacer 125 formation, a portion of the epi-merge layer 105' is exposed and another portion of the epi-merge layer 105' is covered by the dummy spacer 125.

Some residual dummy spacer material 125 may be left on top of the metal gate or on top of any remaining hard mask material 117. As residual material is not a preferred embodiment, it is not shown in the figures.

As deposited the dummy spacer material is from about 10 nm to 50 nm and ranges there between, and preferably about 40 nm thick. After material is etch, the dummy spacer can be up to about 25 nm at its widest point, and is preferably between about 10 nm to about 15 nm at its widest point.

Dummy spacer 125 can be formed from silicon oxide, silicon nitride, silicon carbide, silicon oxynitride or silicon carbon-nitride films and is preferably a silicon nitride ($Si_xN_yH_z$) film. Dummy spacer 125 can be deposited using a variety of techniques including physical vapor deposition, chemical vapor deposition or atomic layer deposition. The dummy spacer material is etched by reactive ion etching (RIE) with fluorine-based chemistries such as, but not limited to, $CH_2F_2$, $CHF_3$, $CF_4$ and combinations of fluorine-based chemistries.

Referring to FIGS. 6A-B, making a FinFET with recessed epi-merge region involves removing a portion of the epi-merge layer 105' to form an epi-merge field region 128, an epi-merge sidewall 127, and an epi-merge spacer region 129. The epi-merge field region 128 is the exposed portion of epi-merge layer 105' remaining after the recess etch. The field region 128 thickness can vary. The field region 128 thickness can be as little as 5 nm, and is preferably about 15 nm to about 20 nm.

The epi-merge sidewall 127 is formed as a result of etching the exposed portion of the epi-merge layer 105' while the portion of the epi-merge layer 105' under the dummy spacer 125 is protected from etching. The epi-merge sidewall is roughly vertical (i.e. perpendicular to the substrate) and is from about 10 nm to about 25 nm high and ranges there between.

The epi-merge spacer region 129 is that portion of the epi-merge layer 105' that was not etched because it was protected by the dummy spacer 125. Thus, the epi-merge spacer region has a height roughly equal to the height of fin 105 which is approximately equal to the height of original epi-merge layer 105'.

In FIGS. 6A and 6B the cross-sections show the sidewall of the gate stack (i.e. sidewalls of the metal gate 115 and high-k material 110) and dummy spacer 125; accordingly, the epi-merge field region 128, the epi-merge sidewall 127, and the epi-merge spacer region 129 can be seen in these cross-sections. Thus, after recessing the epi-merge layer 105', an epi-merge field region 128 and an epi-merge sidewall 127 are formed and exposed, while an epi-merge spacer region 129 is covered by the dummy spacer 125.

Making a FinFET with recessed epi-merge region involves forming a silicide 130 layer with the epi-merge field region 128 and simultaneously forming a sidewall silicide 131 with the epi-merge sidewall 127.

Figure 7A:
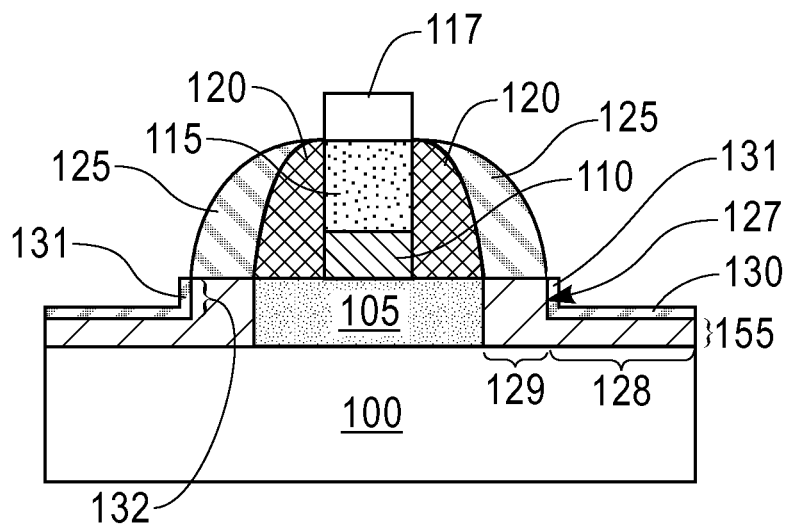
FIG. 7A illustrates a cross section of a MOSFET after silicidation according to an embodiment of the current invention. The cross-section along the y-axis following a merged fin as it goes under the gate stack.
Figure 7B:
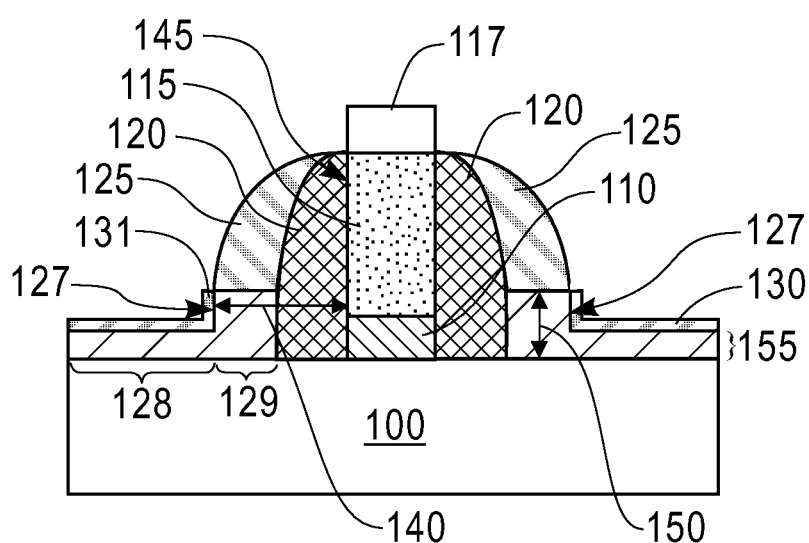
FIG. 7B illustrates a cross section of a MOSFET after silicidation according to an embodiment of the current invention. The cross-section is through the gate-stack along the y-axis according to an embodiment of the invention.
Figure 8A:
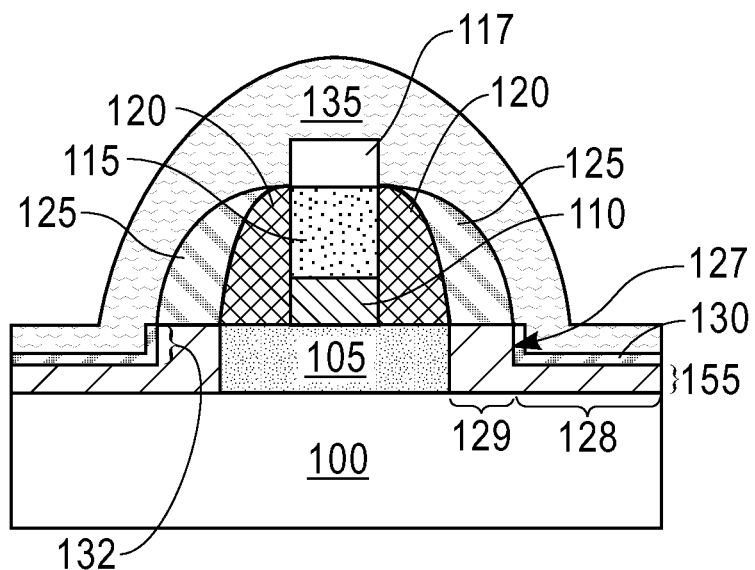
FIG. 8A illustrates a cross section of a MOSFET after stress liner deposition according to an embodiment of the current invention. The cross-section along the y-axis following a merged fin as it goes under the gate stack.
Figure 8B:
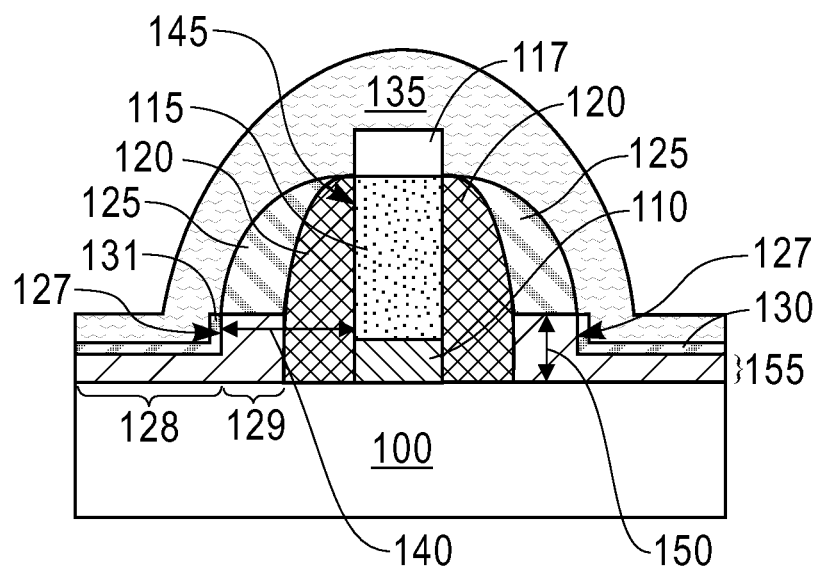
FIG. 8B illustrates a cross section of a MOSFET after stress liner deposition according to an embodiment of the current invention. The cross-section is through the gate-stack along the y-axis according to an embodiment of the invention.

In FIGS. 7A and 7B the cross-sections show the sidewall of the gate stack (i.e. sidewalls of the metal gate 115 and high-k material 110) and dummy spacer 125; accordingly, the epi-merge field region 128, the epi-merge sidewall 127, and the epi-merge spacer region 129 can be seen in these cross-sections. Thus, the silicide layer 130 formed with the epi-merge field region 128 and the sidewall silicide 131 formed with the epi-merge sidewall 127 can be seen in FIGS. 7A and 7B.

The silicide is formed by depositing a metal film and then heating it so that it reacts with the epi-merge field region 128 and epi-merge sidewall 127. Suitable metal materials include cobalt, nickel, tungsten, platinum, erbium or ytterbium. The preferred metal is nickel and, thus, the preferred silicide is a nickel silicide. The thickness of the as deposited metal is from about 10 nm to about 50 nm. As the substrate with the deposited metal is heated to a temperature in the range of from about 200 C to about 600 C and ranges there between.

During silicide formation, a portion of the epi-merge field region 128 is consumed. As a result, the thickness of the silicide layer 130 can be about 5 nm to about 30 nm and is preferably about 10 nm, while the remaining, unconsumed, epi-merge field region 128 thickness 155 can range from about 0 nm to about 15 nm and ranges therebetween, and is preferably 5 nm (See FIGS. 7A and 7B). Similarly, during silicide formation, a portion of the epi-merge sidewall 127 can be consumed. As a result, the thickness of the sidewall silicide 131 can be about 5 nm to about 30 nm and is preferably about 10 nm. And the distance 140 between the sidewall silicide 131 and the gate stack sidewall 145 is from about 10 nm to about 50 nm and ranges there between, and is preferably 20 nm (See FIG. 7D). It should be noted, that the sidewall silicide 131 can be thinner than the silicide 130 layer in the epi-merge field region 128.

Referring again to FIG. 7A, it should be noted that the silicide layer 130 forms horizontally along the epi-merge field region 128. Furthermore, a silicide forms along the epi-merge sidewall 127 to form a silicide sidewall 131 having a silicide sidewall height 132. As shown in FIG. 7A, the height 132 of the silicide sidewall 131 is measured from the bottom of the silicide/epi-merge field region interface and up to the silicide adjacent the top of the epi-merge spacer region 129. In other embodiments in which the silicide process consumes the epi-merge field region 128, the height 132 of the silicide sidewall 131 is measured from the bottom of the silicide/substrate buried insulator 100 interface and up to the silicide adjacent the top of the epi-merge spacer region 129 (See FIGS. 9A and 9B). The height 132 of the sidewall silicide 131 can be 5 nm to about 50 nm and ranges there between.

Finally, referring to FIG. 7B, it should be noted that the height 150 of the epi-merge spacer region 129 is from about 10 nm to about 80 nm and ranges there between, and is preferably from about 30 nm to about 50 nm and ranges there between.

Making a FinFET with recessed epi-merge region involves depositing a stress liner 135 over the substrate after silicide formation. In a preferred embodiment shown in the FIGS. 8A-B, the stress liner covers the entire surface of the FinFET, thus it is over the field regions 128 as well as the gate stack (high-k 110 and metal gate 115) and the spacers (dummy 125 and off-set 120). In other embodiments, the stress liner may just be formed over one or more of the following: the epi-merge field region 128, the epi-merge spacer region 129, and the off-set spacer 120.

The stress liner material can include silicon oxide, silicon carbide, silicon nitride, silicon oxynitride and silicon carbonitride with tensile stress for NFET and similarly for PFET, silicon oxide, silicon carbide, silicon nitride, silicon oxynitride and silicon carbonitride films with compressive stress can be used. Preferably silicon nitride with tensile stress is used for NFET and silicon nitride with compressive stress is used for PFET device. The thickness of the stress liner can be from about 20 nm to about 100 nm and ranges there between, and is preferably about 50 nm. The stress liner material can be deposited by a variety of methods including physical vapor deposition, chemical vapor deposition and atomic layer deposition.

From this point on, conventional MOSFET formation steps are followed. Thus, this concludes the description of the method of making high performance FinFETs with a recessed epi-merge region and vertical silicide. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

Next, embodiments of the FinFETs created by methods previously described are illustrated.

Figure 9A:
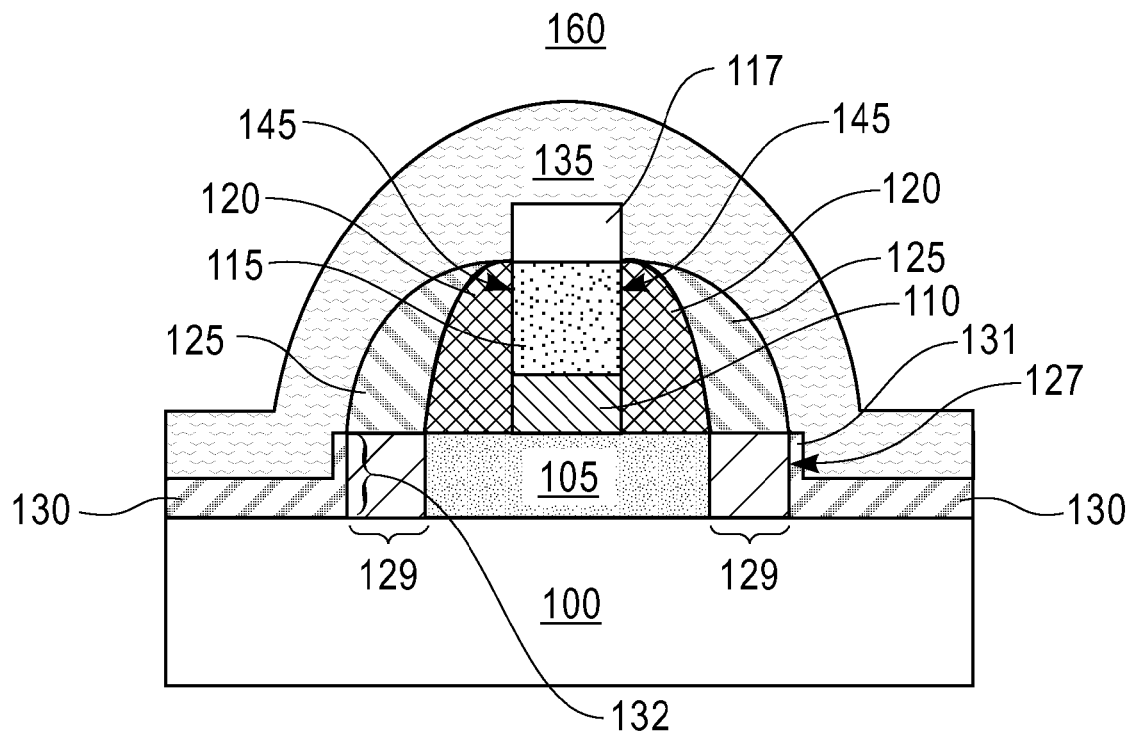
FIG. 9A illustrates a MOSFET made according to an embodiment of the current invention in which the entire epi-merge-field region 128 has been consumed in forming the field silicide 131. The cross-section along the y-axis following a merged fin as it goes under the gate stack.
Figure 9B:
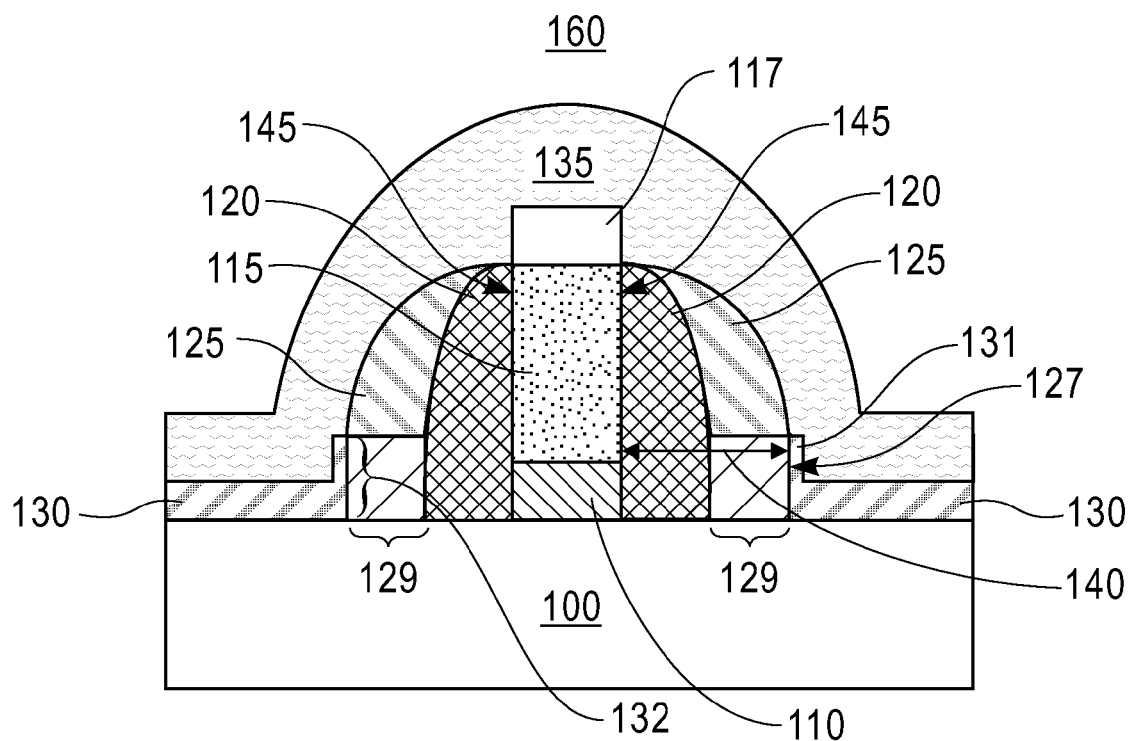
FIG. 9B illustrates a MOSFET made according to an embodiment of the current invention in which the entire epi-merge-field region 128 has been consumed in forming the field silicide 131. The cross-section is along the y-axis through the gate stack.

FIGS. 9A-9B illustrates an embodiment of a MOSFET 160 with a vertical silicide made by a recessed epi-merge method. FIG. 9A is a cross section along the y-axis at a juncture in which the gate stack crossed over a fin 105. The MOSFET 160 includes a substrate with a buried insulator region 100, a gate stack above the buried insulator region wherein the gate stack has at least one sidewall 145. The gate stack includes a high-k 110 layer and a metal gate 115 previously described. The MOSFET 160 also includes an off-set spacer 120 adjacent the gate stack sidewall, a dummy spacer 125 adjacent at least a portion of the off-set spacer, an epi-merge spacer region 129 above the substrate with buried insulator region 100 and below the dummy spacer 125. The MOSFET also has a field silicide 130 above the substrate with buried insulator region 100; and a stress liner 135 above the field silicide 130.

In addition the MOSFET 160 has an epi-merge sidewall 127. The epi-merge sidewall is a sidewall of the epi-merge-spacer region 129. A sidewall silicide 131 is formed with the epi-merge sidewall 127. The height 132 of the sidewall silicide has been previously described in conjunction with FIGS. 7A-B and step 70 (silicide formation).

FIG. 9B is a cross section along the y-axis at a juncture in which the gate stack does not cross over a fin 105, but instead, the gate stack extends to the substrate buried insulator 100. Thus in FIG. 9B, the MOSFET's 160 epi-merge-spacer region 129 is adjacent to the off-set spacer 120, rather than adjacent the fin 105 as in FIG. 9A. Furthermore, in FIG. 9B, the off-set spacer 120 above of the substrate buried oxide 100, but in FIG. 9A, there is a fin 105 between the off-set spacer 120 and the substrate buried oxide 100.

In addition, MOSFET 160 as shown in FIG. 9B has a distance 140 between the sidewall silicide 131 and the gate stack sidewall 145 which was previously described in conjunction with FIG. 7B and step 70 (silicide formation).

Figure 10A:
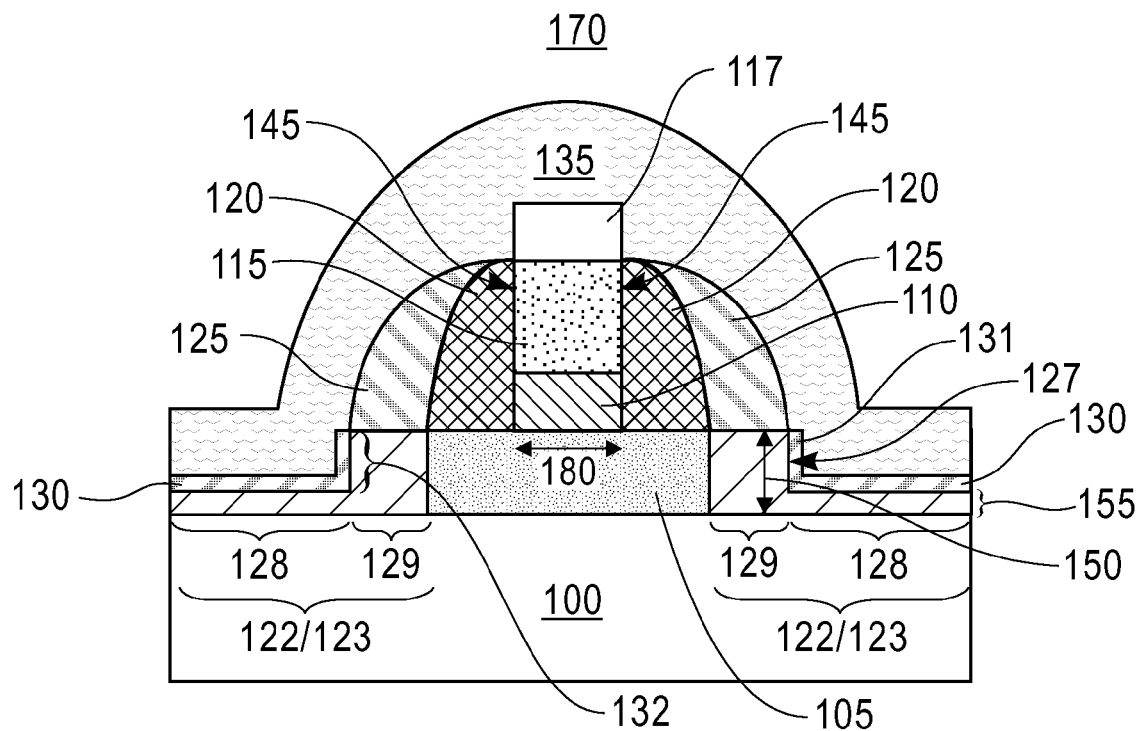
FIG. 10A illustrates a MOSFET made according to an embodiment of the current invention. The cross-section along the y-axis following a merged fin as it goes under the gate stack.
Figure 10B:
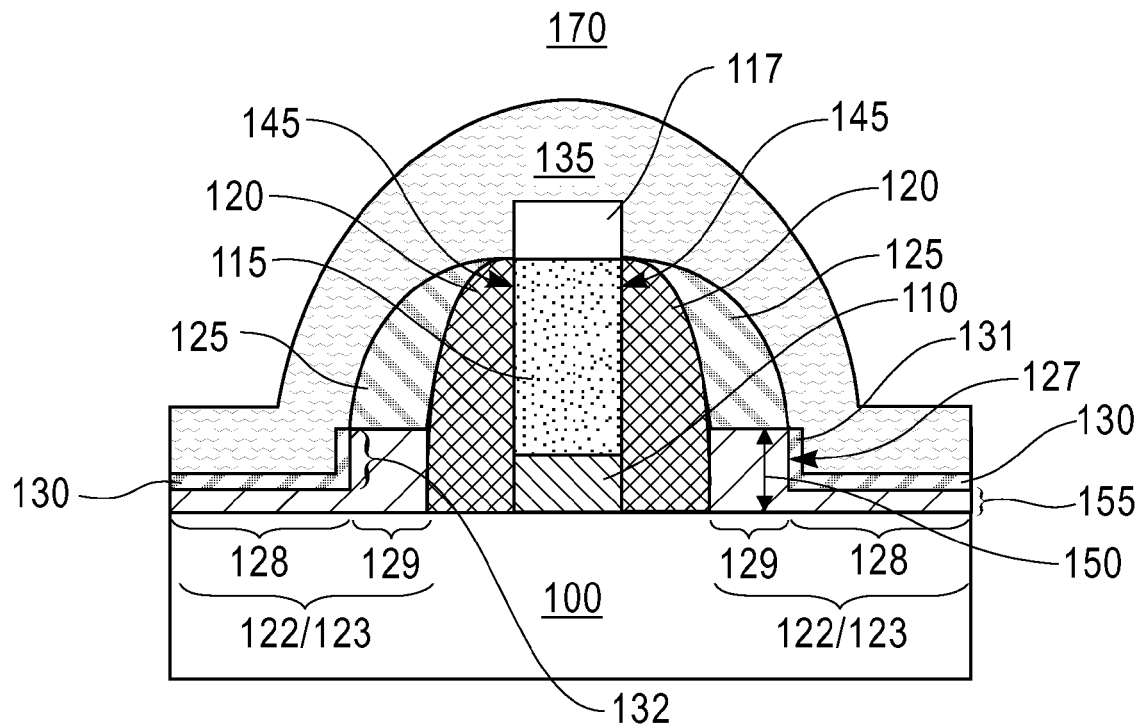
FIG. 10B illustrates a MOSFET made according to an embodiment of the current invention. The cross-section is along the y-axis through the gate stack.

Referring to FIGS. 10A and 10B, in a preferred embodiment, a MOSFET 170 also includes an epi-merge-field region 128 between the field silicide 130 and the substrate buried insulator 100. Here, in the preferred embodiment, the epi-merge field region 128 exists because not all of it was consumed during silicide formation of step 70. Typically, the epi-merge-spacer region 129 has a thickness 150 which is greater than a thickness 155 of the epi-merge-field region 128. The thickness 150 of the epi-merge-spacer region 129 and the thickness 155 of the epi-merge-field region 128 were previously discussed in conjunction with step 70 and FIGS. 7A and 7B.

In either embodiment 160 or 170 of the MOSFET a stress liner 135 is above the field silicide 130 and preferably is also above the gate stack which includes the metal gate 115 and high-k layer 110.

Referring to FIG. 10A, the MOSFET 170 can further be described as having a source (122)/and a drain (123). The source and drains were formed in step 40, after the fins 105 were merged to form the epi-merge layer 105'. As a result, the source/drains (122/123) include the epi-merge-field region 128 and the epi-merge-spacer region 129. While not drawn so in FIG. 10A, those skilled in the art will recognize that a portion of the source/drains (122/123) may also extend under the off-set spacer 120. The source/drains (122/123) may even extend under the gate stack, particularly if the extension implant described step 30 was performed. The region of the fin 105 between the source/drains 122/123 and near the high-k layer 110 is called the channel 180. The channel position (meaning its length) can vary depending on the doping, therefore, in FIG. 10A the channel is indicated by the arrows and reference numeral 180 at the top of the fin 105. Above the channel is the gate stack which includes the high-k layer 110 and metal gate 115. Finally, because the source/drain (122/123) includes the epi-merge-field region 128 and epi-merge-sidewall 127, it can be said that a silicide layer (including the field silicide 130 and the sidewall silicide 131) is on the source and drain wherein in a portion of the silicide layer (sidewall silicide 131) is perpendicular to the channel. While the description of the source/drain (122/123) and channel was made with reference to FIG. 10A, the same concepts apply to FIG. 9A.

An advantage of the recessed epi-merge layer is that the stress liner is closer to the bottom of the merged fin/source drain area and thus closer to the channel of the transistor as compared to other 3D MOSFETS. The closer proximity of the liner to the channel results in improves stress transfer to the channel and improves the device performance as compared to non-recessed 3D devices. In particular, at the same leakage current ("Ioff"), a device made by the present invention can have 10-25% better performance than a non-planar device made without a recessed epi-merge layer and stress liner. As a result, the current invention enables a MOSFET to run at high speeds without consuming too much power.

A further advantage of the recessed epi-merge region in an embodiment of the current invention is that a vertical strip of silicide can be intentionally formed. The vertical silicide is vertical with respect to the wafer surface, meaning it is perpendicular to the wafer surface. By being vertical, the silicide is also formed in the plane of the channel, and thus reduces spreading resistance. Spreading resistance is the resistance a carrier experiences while traveling through the source or drain region and typically is 200 to 300 ohm-um, however, in the current invention, resistance is reduced by 50-100 ohm-um.

An additional advantage of an embodiment of the invention using dummy spacers is that by forming the dummy spacers after source/drain ion implantation, the gate is shielded from possible silicide encroachment during a subsequent silicidation step. Control of silicide encroachment is important to minimize the possibility of shorting to the gate; thus the dummy spacer widens the process window of FinFET manufacturing.

In yet another advantage of the current invention, effective switching capacitance (Ceff) is reduced due to the lower PC-to-epi fringe capacitances. An epi-fringe capacitance refers to the capacitive coupling between the gate and the epitaxy (epi) film. Capacitive coupling is especially severe in case of 3D devices as there is a finite "dead" space in between the fins. In places in which the dead space between the fins is covered by the gate material, the parasitic capacitance increases. The parasitic capacitance increases because there is a finite gate-to-epi capacitance between the gate material in the space between the fins and the epi outside (i.e. the gate material in the space between the fins and the epi are separated by spacer(s)). A structure which reduces this parasitic capacitance will help to significantly alleviate the 3-D structure capacitance penalty. By recessing the epi-merge region, parasitic capacitance reduction is lowered in the range of 10-20%.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. In particular, various combinations of off-set spacer use (or not), raised source drain use (or not), and full or partial refill of the recess are within the scope of specification. The scope of the following claims is to be accorded the broadcast interpretation so as to encompass all such modifications and equivalent structures and functions.

That which is claimed is:

1. A MOSFET, comprising:
   a substrate with a plurality of fins and a buried insulator region;
   a gate stack above the buried insulator region wherein the gate stack has at least one sidewall;
   an off-set spacer adjacent the gate stack sidewall;
   an epi-merge layer comprising an epitaxial film that merges the plurality of fins;
   a dummy spacer adjacent at least a portion of the off-set spacer;
   an epi-merge spacer region above the insulator region and below the dummy spacer, wherein the epi-merge spacer region comprises an unrecessed portion of the epi-merge layer protected by the dummy spacer;
   a field silicide above the buried insulator region; and
   a stress liner above the field silicide.

2. The MOSFET of claim 1, wherein the epi-merge spacer region is adjacent to the off-set spacer.

3. The MOSFET of claim 1, further comprising:
   an epi-merge field region between the field silicide and the buried insulator region, the epi-merge field region comprising a recessed portion of the epi-merge layer not protected by the dummy spacer, wherein the epi-merge spacer region has a thickness which is greater than a thickness of the epi-merge field region.

4. The MOSFET of claim 1, wherein the epi-merge spacer region has a thickness from about 10 nm to about 80 nm.

5. The MOSFET of claim 3, wherein the epi-merge field region has a thickness of about 5 nm to about 30 nm.

6. The MOSFET of claim 1, wherein the stress liner is above the gate stack.

7. The MOSFET of claim 1, wherein a portion of one of the plurality of fins is between the insulator region and the gate stack.

8. The MOSFET of claim 1, further comprising:
an epi-merge sidewall wherein the epi-merge sidewall is a sidewall of the epi-merge spacer region.

9. The MOSFET of claim 8, further comprising:
a sidewall silicide formed with the epi-merge sidewall.

10. The MOSFET of claim 9, wherein the sidewall silicide has a height from about 5 nm to about 50 nm.

11. The MOSFET of claim 9, wherein a distance between the sidewall silicide and the gate stack sidewall is about 10 nm to about 50 nm.

12. The MOSFET of claim 9, wherein the off-set spacer is above the fin portion.

13. The MOSFET of claim 9, wherein the epi-merge spacer region is adjacent to the fin portion.

* * * * *